(12) United States Patent
Rastegar et al.

(10) Patent No.: US 9,071,171 B2
(45) Date of Patent: Jun. 30, 2015

(54) POWER GENERATION DEVICES AND METHODS HAVING A LOCKING ELEMENT FOR RELEASABLY LOCKING AN ELASTIC ELEMENT STORING POTENTIAL ENERGY

(75) Inventors: Jahangir S. Rastegar, Stony Brook, NY (US); Richard T. Murray, Patchogue, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 204 days.

(21) Appl. No.: 13/542,455

(22) Filed: Jul. 5, 2012

(65) Prior Publication Data

US 2013/0181459 A1    Jul. 18, 2013

Related U.S. Application Data

(60) Provisional application No. 61/504,303, filed on Jul. 4, 2011.

(51) Int. Cl.
| | |
|---|---|
| *F42C 11/00* | (2006.01) |
| *H02N 2/18* | (2006.01) |
| *H02K 7/18* | (2006.01) |
| *H01L 35/00* | (2006.01) |

(52) U.S. Cl.
CPC ............ *H02N 2/181* (2013.01); *H02K 7/1853* (2013.01); *H01L 35/00* (2013.01); *H02N 2/18* (2013.01)

(58) Field of Classification Search
CPC ............................... F42C 11/008; F42C 11/02
USPC .................................. 290/1 A, 1 R; 102/207
See application file for complete search history.

(56) References Cited

U.S. PATENT DOCUMENTS

| | | | | |
|---|---|---|---|---|
| 3,604,357 | A * | 9/1971 | Duncan .......................... | 102/229 |
| 8,490,547 | B1 * | 7/2013 | Rastegar ....................... | 102/207 |
| 2010/0199873 | A1 * | 8/2010 | Rastegar ....................... | 102/262 |

* cited by examiner

*Primary Examiner* — Tho D Ta

(57) ABSTRACT

A power generation device including: a housing; an elastic element disposed in the housing in a preloaded state; a power source operatively connected to the elastic element such that release of the elastic element from the preloaded state converts potential energy in the elastic element to electric power by the power source; and a locking element for releasably locking the elastic element in the preloaded state such that removing the locking element causes the potential energy preloaded in the elastic element to be converted to electric power by the power source.

7 Claims, 7 Drawing Sheets

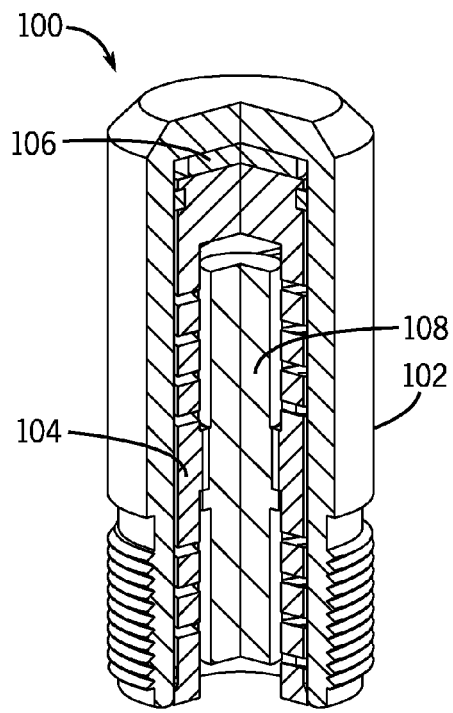
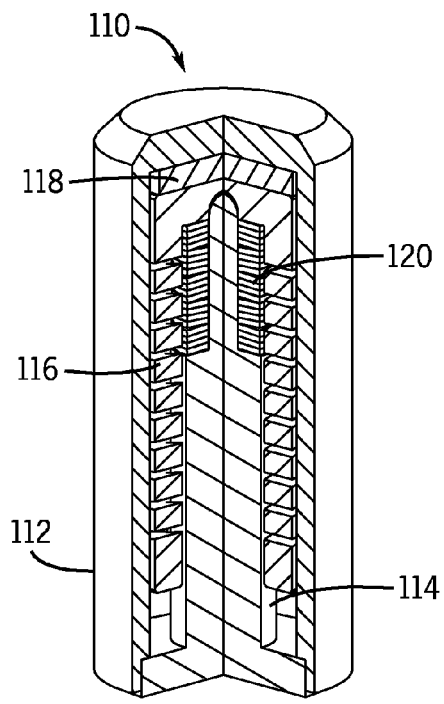
FIG. 1a     FIG. 1b
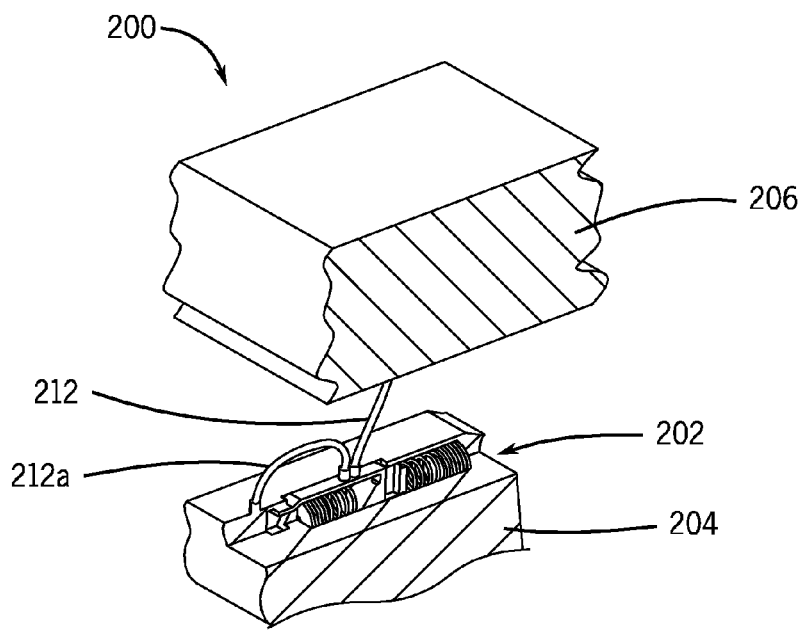
FIG. 2

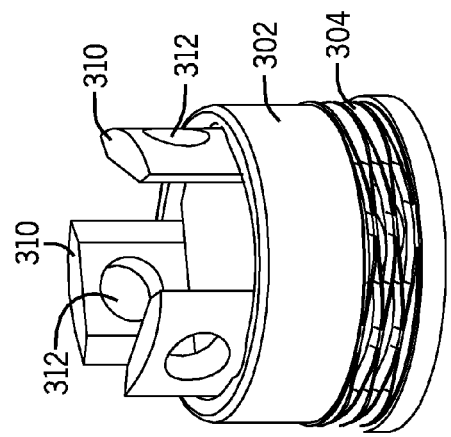
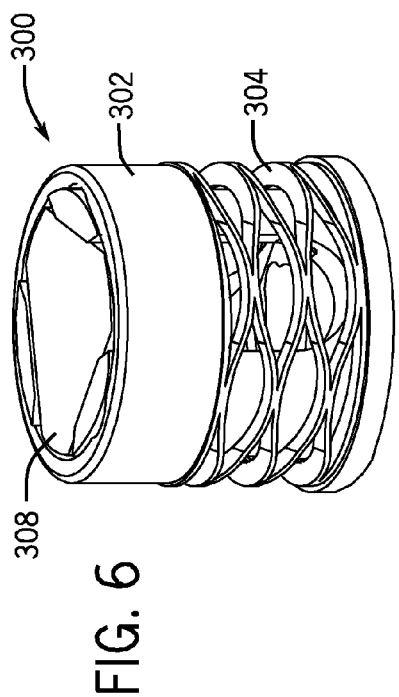
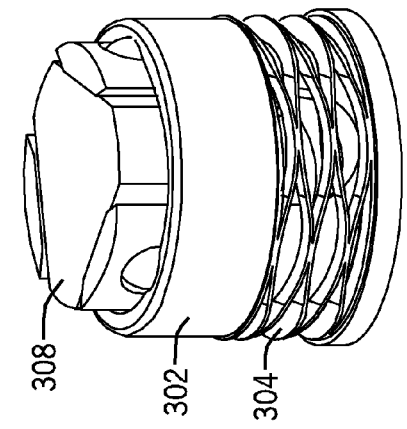
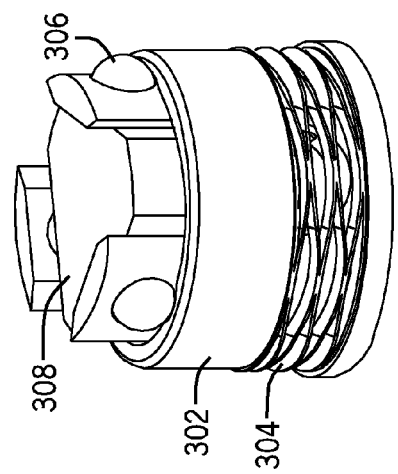
FIG. 6
FIG. 7a
FIG. 7b
FIG. 7c

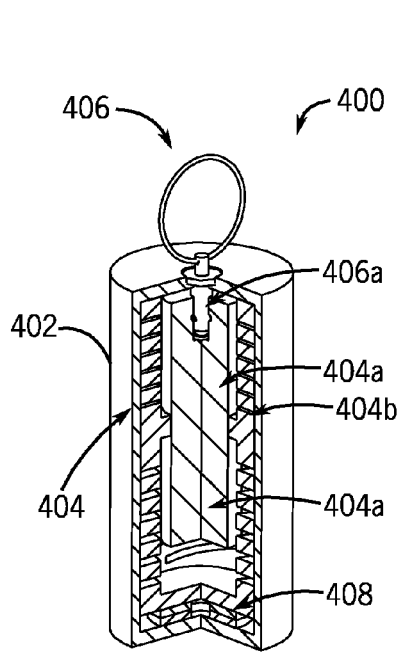
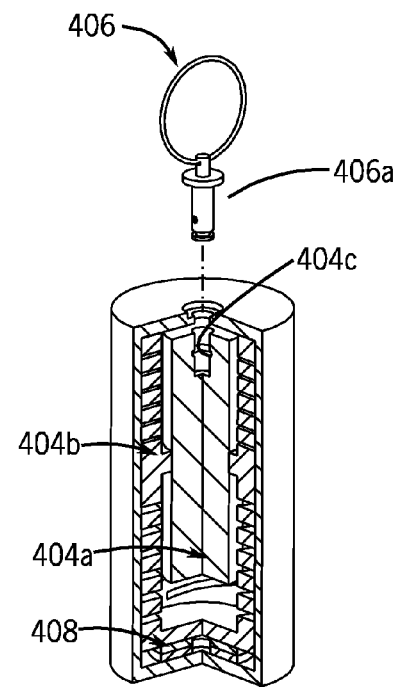
FIG. 8a  FIG. 8b
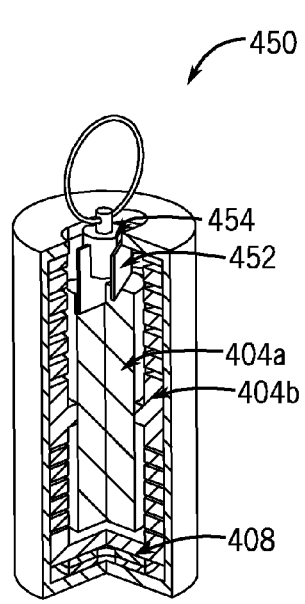
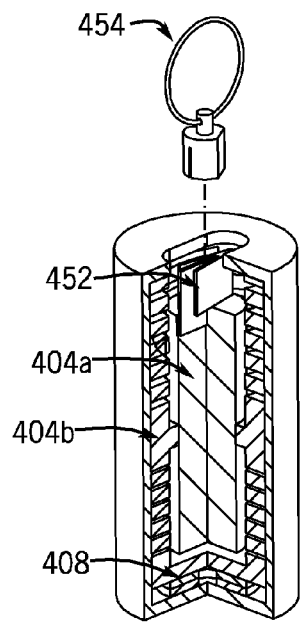
FIG. 9a  FIG. 9b

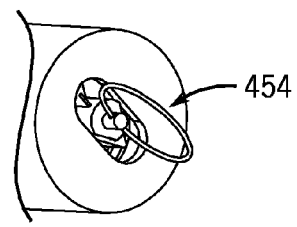
FIG. 9c
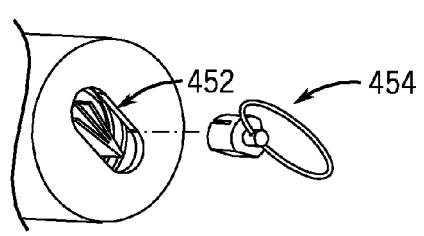
FIG. 9d
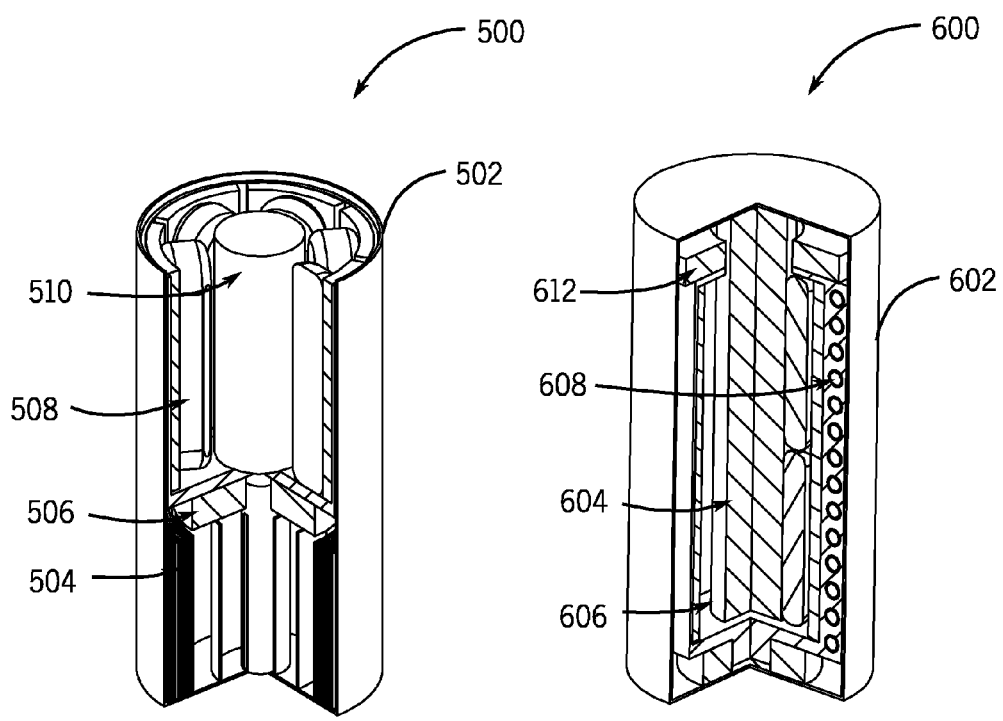
FIG. 10
FIG. 11

POWER GENERATION DEVICES AND METHODS HAVING A LOCKING ELEMENT FOR RELEASABLY LOCKING AN ELASTIC ELEMENT STORING POTENTIAL ENERGY

CROSS-REFERENCE TO RELATED APPLICATION

This application claims the benefit of U.S. Provisional Application No. 61/504,303 filed on Jul. 4, 2011, the entire contents of which is incorporated herein by reference.

BACKGROUND

1. Field

The present invention relates generally to power generation devices, and more particularly, to innovative power generation devices and methods to replace thermal batteries currently being used as the primary power source to generate the energy necessary to actuate a variety of electric-initiator-based energetic devices, such as Cartridge Actuated Devices (CAD) and Propellant Actuated Devices (PAD). Such power generation devices and methods have a long shelf life, e.g., over 20 years; require no external power source for activation (no batteries); are highly reliable; are low-cost relative to conventional thermal batteries; and are suitable for applications in which power is required over a relatively long time, e.g., of the order of 4-10 minutes or more.

The power generation devices and methods of the present invention can replace thermal batteries as the source of power to actuate a variety of electric-initiator-based energetic devices, such as Cartridge Actuated Devices (CAD) and Propellant Actuated Devices (PAD) and meet their performance requirements. The power generation devices and methods can meet specifications such as a power source of 1.7 inch diameter and 3.5 inch long cylinder, and the topic provided required electrical energy level of 4.7 KJ. The power generation devices and methods can provide the indicated power of 22 volts and 0.95 amps in less than 100 milliseconds for at least 225 seconds (the aforementioned 4.7 KJ of energy) within the temperature range of negative 65 to positive 200 degrees Fahrenheit.

2. Prior Art

Thermal batteries are currently the primary power source used to generate the electrical energy necessary to actuate a variety of electric-initiator-based energetic devices, such as Cartridge Actuated Devices (CAD) and Propellant Actuated Devices (PAD). The current state-of-the-art thermal batteries, however, have a number of shortcomings for the above applications, including:

Lack of adequate level of reliability;
Relatively short run time;
In many applications they do not have the capacity to provide the amount of power required to support missions involving high duty cycles at elevated temperatures;
They do not provide an adequately long enough shelf life;
Thermal batteries have to be designed for each specific use;
They require their own battery for electric initiation energy needs;
In systems incorporating a variety aforementioned devices they require more than one battery, with varying size, shape, and capacity for electrical initiation;
Thermal batteries are expensive and difficult to procure because of the very limited supply base;
Thermal batteries occupy a relatively large volume and add a significant amount of weight to weapons in which weight and space are at a premium;
Thermal batteries present environmental hazards in their production, use, and disposal, since they contain chemicals that the Occupational Safety and Health Administration (OSHA) have identified as harmful.

A need therefore exists for the development of power generation devices and methods to generate power that can be used in place of thermal batteries and that fills the cost, environmental, shelf life, and performance gaps that currently exist. Furthermore, the solution must provide the flexibility for multi-application use.

SUMMARY

Accordingly, a power generation device is provided. The power generation device comprising: a housing; an elastic element disposed in the housing in a preloaded state; a power generation device operatively connected to the elastic element such that release of the elastic element from the preloaded state converts potential energy in the elastic element to electric power by the power generation device; and a locking element for releasably locking the elastic element in the preloaded state such that removing the locking element causes the potential energy preloaded in the elastic element to be converted to electric power by the power generation device.

The elastic element can be a spring and the spring can be coupled to a mass to form a mass-spring unit. The power source can be a piezoelectric material disposed in the housing such that release of the locking element vibrates the mass-spring unit resulting in a cyclic compressive load being applied to the piezoelectric material to generate the electric power from the piezoelectric material. The piezoelectric material can be disposed between an inner surface of the housing and a surface of the spring.

The elastic element can be a torsional spring, which when released, provides rotation to a shaft of a dynamo generator operatively connected to the torsional spring. The power generation device can further comprise a clutch operatively connected between the torsional spring and the shaft of the dynamo. The locking element can be disposed in a bore in the mass. The locking element can further comprise a pull ring for facilitating manual removal of the locking element from the bore in the mass.

The mass can further include locking tabs and the locking element is retained to the mass by engagement of the locking tabs with the locking element.

A method for generating power is also provided. The method comprising: storing energy in a spring disposed in a housing; locking the spring in a state in which the energy is stored; manually releasing, or instructing the release of, the spring from the state in which energy is stored; and transferring the stored energy to electric power due to the release of the spring from the state in which energy is stored.

The transferring can comprise providing cyclic compressive forces to a piezoelectric material disposed in the housing.

The transferring can comprise providing rotation to a shaft of a dynamo generator operatively connected to the spring.

The releasing can comprise pulling a release member from a mass operatively connected to the spring.

Still further provided is a power generation device comprising: a housing; a dynamo stator disposed in the housing; a dynamo rotor rotatably disposed in the housing relative to the dynamo stator; a coil assembly fixed to the dynamo stator; and a magnet assembly fixed to the dynamo rotor; wherein the dynamo rotor includes a plurality of propellant charges directed such that activation thereof results in rotation of the dynamo rotor relative to the stator and rotation of the magnet assembly fixed to the dynamo rotor to provide relative rotation between the magnet assembly and coil assembly to output electrical power.

The power generation device can further comprise means for initiating at least one of the plurality of propellant charges.

Still further yet provided is a manually initiated power source comprising: a housing; a thermal battery provided in the housing; an energy storage device operatively connected to the thermal battery to store energy produced by the thermal battery; and an initiator operatively engaged with the thermal battery for providing at least one of a spark or flame to initiate the thermal battery upon a manually operation of the initiator.

The energy storage device can be a super capacitor.

The thermal battery can include a central corridor, where the initiator is positioned such that the at least one of the spark or flame traverses the central corridor to facilitate initiation of the thermal battery.

BRIEF DESCRIPTION OF THE DRAWINGS

These and other features, aspects, and advantages of the apparatus and methods of the present invention will become better understood with regard to the following description, appended claims, and accompanying drawings where:

FIG. 1a illustrates a first piezoelectric-based energy harvesting power source.

FIG. 1b illustrates a conventional piezoelectric-based energy harvesting power source.

FIG. 2 illustrates a isometric view of a piezoelectric-based lanyard-driven electrical power generator mounted in a weapon and attached to a weapon rack.

FIG. 6 illustrates an isometric view of a miniature inertial igniter shown next to an end of a pencil for a size comparison.

FIGS. 7a-c illustrate the miniature inertial igniter of FIG. 6 in different phases of an all-fire acceleration event.

FIGS. 8a and 8b illustrate a piezoelectric energy harvesting power source before and after manual activation.

FIGS. 9a and 9b illustrate a variation of the piezoelectric energy harvesting power source of FIGS. 8a and 8b before and after manual activation.

FIGS. 9c and 9d illustrate top views of the piezoelectric energy harvesting power sources of FIGS. 9a and 9b, respectively.

FIG. 10 illustrates a cut-away sectional view of a dynamo-type power source.

FIG. 11 illustrates a cut-away sectional view of a propellant driven dynamo power source.

DETAILED DESCRIPTION

Figure 3:
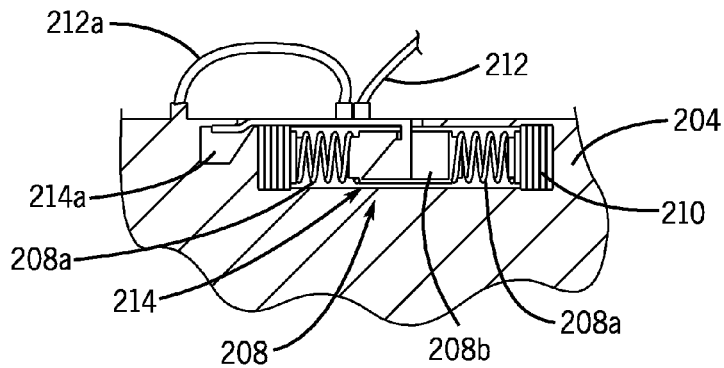
FIG. 3 illustrates a sectional view of the piezoelectric-based lanyard-driven electrical power generator of FIG. 2.

The power generation devices and methods of the present invention can be configured to have the capability of providing 22 volts within 105 milliseconds at 200 degrees Fahrenheit and within 130 milliseconds at negative 65 degrees Fahrenheit and supply a continuous load of 0.95 ampere for at least 225 seconds.

Based on the above power source requirements and an indicated initial baseline available volume, such as 1.7 inch diameter and 3.5 inch long cylinder, a number of novel power generation concepts are disclosed herein.

Piezoelectric-based energy-harvesting power sources for U.S. Army and Navy munitions and U.S. Air Force gravity dropped weapons have been developed. See U.S. Pat. Nos. 7,312,557; 7,231,874; 7,762,192; 7,762,191; 7,701,120; 7,821,183 and 7,777,396, each of which are incorporated here by reference. A summary of such devices are disclosed in FIGS. 1-4.

Such power sources harvest energy from the environment and are ideal for many munitions and possibly CAD and PAD, and numerous commercial applications because they are safe, provide long shelf life, and are low-cost compared to reserve and rechargeable batteries. These power sources can generate sufficient power for many applications with low to medium power requirements.

In the past, piezoelectric-based devices have generated electrical energy from imparted shock/impact, acoustic noise, and vibration. But the quantity produced has been feeble. By contrast, the power sources disclosed in the above U.S. patent Nos. can store shock/impact and vibration energy in spring elements, and subsequently harvest it as electricity at a desired rate from the vibration of a mass-spring system attached to piezoelectric element(s). With this approach, during impact or firing of a gun, for example, the spring element of the generator is deformed due to inertial forces acting on the system. Potential energy is thereby stored in the spring elements. The stored potential energy causes the spring-mass element to vibrate at its natural frequency. Piezoelectric elements or generators can then convert the mechanical energy of vibration into electrical energy.

The power sources are generally packaged to withstand high shock and vibration levels, including the firing of large caliber guns. To date, prototypes of several classes of such piezoelectric-based energy harvesting power sources have been designed, fabricated, and successfully tested in impact tests, drop tests, air-gun tests, and firing tests at over 45,000 Gs. The power sources generate electrical energy from the firing shock and from vibration during flight.

The piezoelectric-based energy-harvesting power sources are suitable for applications that have low to medium power requirements, particularly when safety and long shelf life are critical factors. For example, two such energy-harvesting power source designs are shown in FIGS. 1a and 1b, which are designed to store up to 1 J of mechanical energy as a result of firing shock.

Referring to FIG. 1a, the power source 100 illustrated therein includes a housing 102 having a double-ended mass-spring element 104 which vibrates upon an acceleration/deceleration event. The mass-spring element 104 is attached to one or more piezoelectric elements 106 to generate electrical energy upon the vibration of the mass-spring element 104. An Additional mass 108 is provided to tune the natural frequency of the mass-spring element. In FIG. 1a, the power source 100 is packaged in a housing which is approximately a 1.00-inch diameter, 2.25-inch long cylinder.

Referring now to FIG. 1b, the power source 110 includes a housing 112 having a pre-loading support 114 disposed therein. A mass-spring unit 116 is disposed over the pre-loading support 114. As in the power source of FIG. 1a, the mass-spring element 116 is attached to one or more piezoelectric elements 118 to generate electrical energy upon the vibration of the mass-spring element 116. Bellville spring washers 120 are used to pre-load the piezoelectric element(s) 118. In FIG. 1b, the power source is packaged in a 0.75-inch diameter, 1.75-inch long cylinder, and is designed to withstand firing accelerations of over 50,000 Gs.

The amount of mechanical energy to be stored in the mass-spring elements during firing (acceleration) or impact (deceleration) can be later available for harvesting and can be tuned for a particular application by varying spring design parameters. The resonant frequency of the generator spring may also be tuned to satisfy the rate at which electrical energy is made available. Electrical energy can also be generated during the flight due to vibration and other oscillatory motions.

The efficiency of converting mechanical to electrical energy depends on the generated charge collection and storage electronics, with typical efficiencies of 30-50% or more. The electrical energy generated is usually used to directly drive a load or can be stored in a secondary device such as a capacitor or rechargeable battery.

Piezoelectric-based energy harvesting power sources that are impact-based have numerous applications in emergency devices. An innovative two-stage method can harvest energy from low and varying frequency oscillatory or rotary motions [see, e.g., Rastegar, J., and Murray, R., "Novel Two-Stage Piezoelectric-Based Electrical Energy Generators for Low and Variable Speed Rotary Machinery," SPIE 16$^{th}$ Annual Intern. Symp. on Smart Structures and Materials, 7643-11, San Diego, Calif. (2010)]. Envisioned applications for these units include power for remote sensors on vehicles or ships. Two-stage rotary harvesters are well-suited to serve as high-efficiency generators for windmills, tidal flow turbines, and other similar turbo-machinery.

Two novel classes of lanyard-driven electrical power generators for use in gravity dropped weapons that can overcome a number of shortcomings of the currently available (air turbine based) devices such as problems with very high and very low altitude drops have also been developed. The developed power sources would also provide drop and a number of other event detection capabilities for "safe" and "arm" (S&A) functionality. Two of the aforementioned event detection and power generation devices, one belonging to the class of piezoelectric-based devices and one belonging to the class of dynamo-based devices are presented. A combination of the two may be used to achieve very fast (1-2 msec) event detection and electricity generation as well as high power generation capability.

Figure 4:
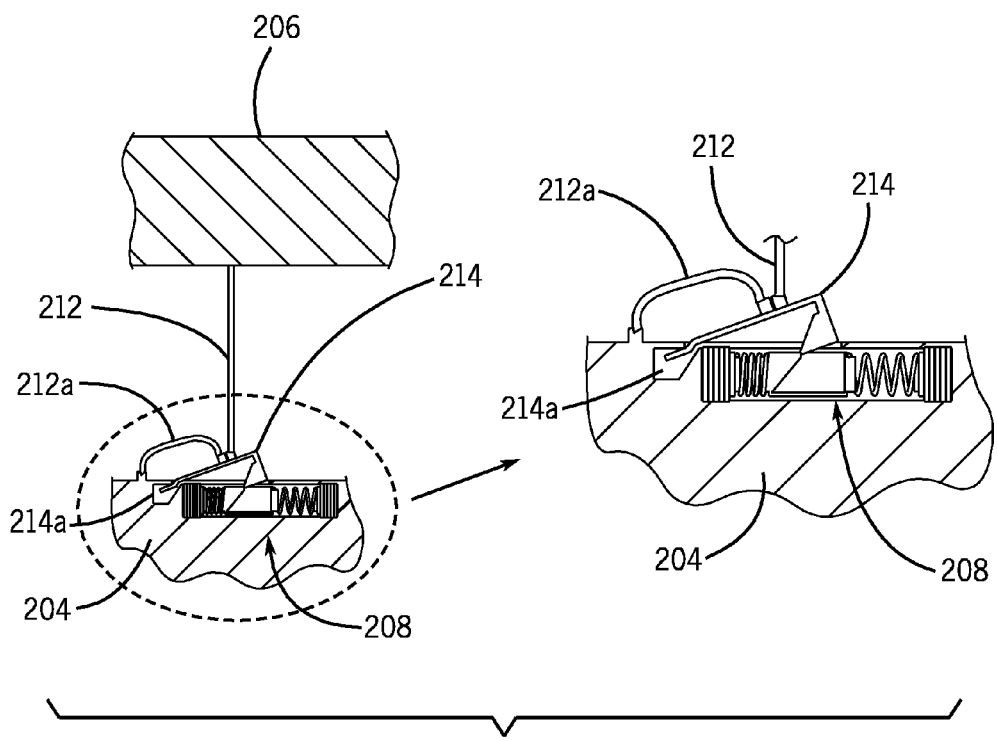
FIG. 4 illustrates a side view and blown up view of the piezoelectric-based lanyard-driven electrical power generator mounted in a weapon and attached to a weapon rack during deployment of the weapon from the weapon rack.

A schematic of one such piezoelectric-based event detection and power generation device 200 is shown in FIG. 2, showing a position of a piezoelectric based event detection and power generation unit 202 in the weapon 204 relative to the weapon rack 206 on the aircraft. Close-ups of the device are shown in FIGS. 3 and 4. The piezoelectric based event detection and power generation unit 202 consists of a mass-spring unit 208. The mass-spring unit 208 is positioned inside a housing, which is attached to the structure of the weapon 204. A small sealed access port is provided on the weapon shell to expose the upper portion of the device. A set of piezoelectric (stack) elements 210 are positioned between springs 208a of the mass-spring unit 208 and the device housing as can be seen in FIG. 3. When the weapon 204 is mounted onto the rack 206, a weapon lanyard 212 is attached to the weapon 204 at two points as can be seen in FIGS. 2-4. A first portion of the lanyard 212 is attached to the rack 206 on one side and to a spring preloading wedge mechanism link 214 on the other side as shown in FIG. 3. The second portion of the lanyard 212a connects the wedge mechanism link to the weapon body.

When the weapon is released, the weight of the weapon pulls on the aforementioned first portion of the lanyard 212. As a result, the preloading wedge mechanism link 214 is pulled up, causing it to rotate counterclockwise about its hinged (left) end 214a as shown in FIG. 4. As a result, the mass element 208b is pulled to the right, thereby preloading the generator springs 208a. The mass element 208b is then suddenly released as the lanyard 212 is pulled further allowing the (sharp) tip of the wedge to clear the (slot within) mass element 208b. At this point, the mass-spring unit 208 is free to vibrate, thereby applying a cyclic load to the piezoelectric element(s) 210 that are positioned between the spring elements 208a and the generator housing. The cyclic load in turn generates a charge in the piezoelectric element 210, which is then harvested and used directly to power electronics circuitry and logics and/or stored in an electrical energy storage device such as a capacitor or super-capacitor.

By further pulling of the lanyard 212, the spring preloading wedge mechanism link 214 is freed from its "hinge cavity" and would then be "dragged" along by the lanyard 212a as is the case in current weapon design.

Figure 5:
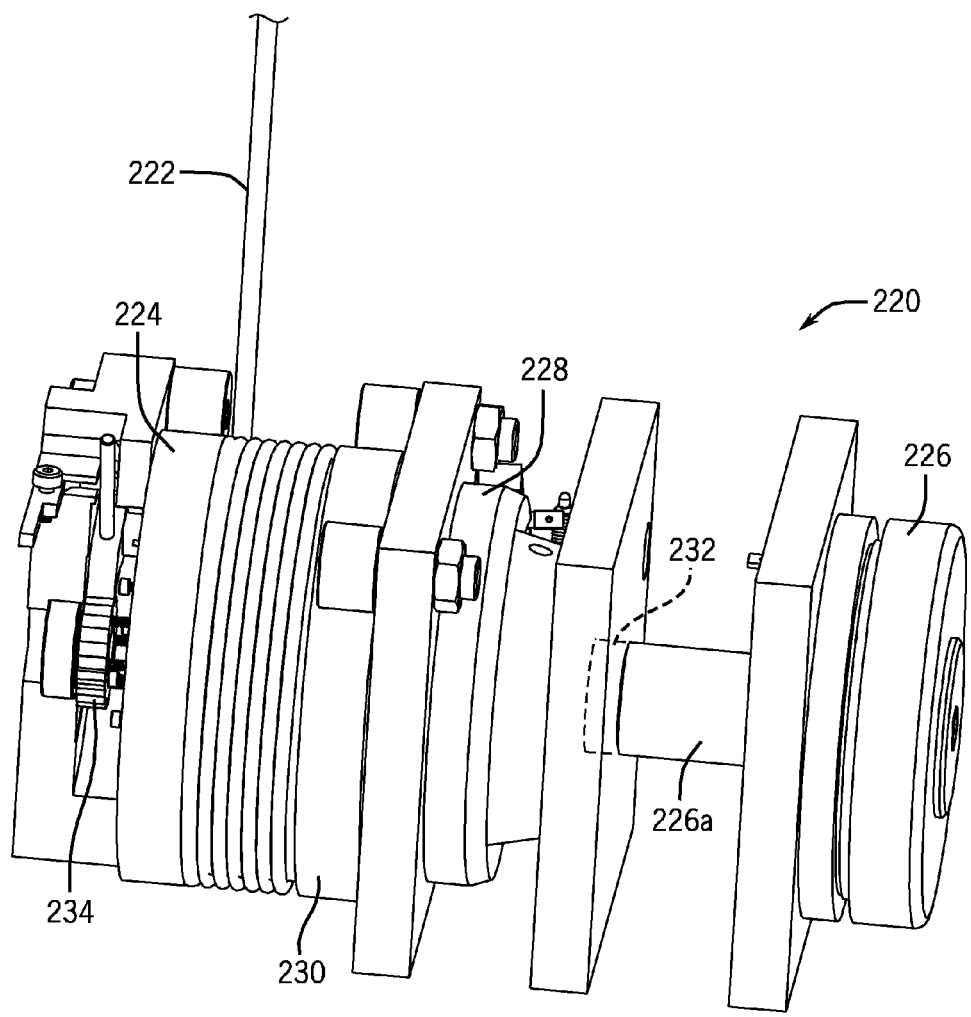
FIG. 5 illustrates a isometric view of a dynamo based lanyard-driven electrical power generator.

FIG. 5 illustrates a lanyard-driven dynamo based generator 220 constructed by connecting the weapon-end of the lanyard 222 to a multi-wrap drum 224 which is the input to a rotary generator 226 mounted within the weapon. For safety and performance, several novel mechanisms are employed between the lanyard pulling and the electrical generator, such as a flywheel 228, power spring 230 and one-way clutch 232.

To provide for safety, when the weapon is mounted on the aircraft, there is no energy stored in the spiral power spring 230 (inside the cable drum), and the shaft of the generator 226 is locked in position, through the flywheel 228, preventing any power generation. When the weapon is released, the lanyard 222 unwinds from the input drum 224, storing energy in the power spring 230. When the lanyard 222 has uncoiled a predetermined length, the lanyard 222 breaks away from the aircraft and descends with the weapon. Just before the lanyard breaks-away, it actuates the locking mechanism which was theretofore holding the flywheel 228 and rotor of the generator 226 stationary (coupled by coupling 226a), and the power spring 230 transfers its stored mechanical potential energy to the generator 226 (as input rotation). A ratchet mechanism 234 on the cable drum 224 can prevent reaction-motion of the cable drum 224, and the one-way clutch 232 allows the flywheel 228 and generator 226 to spin freely after the power spring 230 has unwound completely.

The dynamo-type generator of FIG. 5 may be scaled to satisfy different size and volume and requirements. The power spring 230 of the power source may be pre-wound and released by the actuation of a lever or via detonation of a small charge. In addition, impulse generating charges may be used for winding the power spring 230 or for directly causing the device flywheel 228 to gain and sustain kinetic energy to generate the required amount of electrical energy.

A miniature inertial igniter 300 developed is shown in FIGS. 6 and 7a-7c. Briefly, the miniature inertial igniter 300 consists of a setback collar 302 that is supported by a setback spring 304. The setback collar 302 is biased upward, thereby preventing the setback locking balls 306 from releasing the striker mass 308. The setback collar 302 is provided with a deep enough upper guides 310 to allow certain amount of downward motion before the setback locking balls 306 could be released from their holes 312, as shown in FIG. 7a. The spring rate of the setback spring 304, the mass of the setback collar 302 and the height of the aforementioned upper guide 310 of the setback collar 302 determines the level of no-fire G level and duration that can be achieved. Under all-fire condition, the setback collar 302 moves down (opposite to the direction of the acceleration), as shown in FIG. 7b, thereby releasing the setback locking balls 306 which secure the striker mass 308, allowing them to move outward, thereby releasing the striker mass 308. The striker mass 308 is then free to move under the influence of the remaining acceleration event toward its target, as shown in FIG. 7c, which can be a pyrotechnic material (lead styphnate). The inertial igniter 300 may employ a percussion cap primer. Such an inertial igniter has been tested in the laboratory for model validation and performance tested in centrifuge, drop tests, and in air gun for performance and reliability.

A number of innovative concepts are now presented for power generation that are intended to replace currently used thermal batteries in CAD and PAD and other similar devices. In addition to that disclosed, other methods and means of harvesting/scavenging other sources of energy from the environment, such as heat with thermoelectric or thermophotovoltaic (TPV) cells can be used; Radio Frequency (RF) waves using receiving antennas can be used; and visible light using photovoltaics or thermophotovoltaic cells can be used. Furthermore, combinations of two or more of the described power generation concepts for hybrid power generation devices that take advantage of more than one source of reserved and harvesting/scavenging sources of energy can be used. Still further, integrating power sources, particularly the piezoelectric-based and the other energy harvesting/scavenging types, into the CAD and PAD devices and their structure to minimize the occupied volume and significantly increase the total amount of electrical energy that can be generated can be used.

The examples of power source concepts presented below can all be designed to occupy a small space, such as the aforementioned cylindrical battery space of 1.7 inch in diameter and 3.5 inch long to provide for ease of relative size visualization, however the same can be utilized in other spaces. The release mechanism of such power sources may be equipped with an arming pin which has to be removed before the release mechanism could be operated. It is noted that the amount of electrical power that can be generated is highly dependent on the available space and the operating conditions, particularly for cases involving scavenging/harvesting from the environment. For each class of power source concept that is presented, an estimate of their potential of providing the indicated 4.7 KJ of energy is provided for power sources that are cylindrically shaped with the aforementioned dimensions of 1.7 inch in diameter and 3.5 inch long.

The concepts for piezoelectric energy-harvesting power sources presented here operate by allowing a free-vibrating spring-mass system to transmit a cyclical compressive force to a piezoelectric element. The resultant mechanical strain of the piezoelectric element produces a net electrical charge, which may be extracted for immediate use or storage in a storage medium such as a capacitor. The concepts presented here can utilize a factory-set or user-applied pre-load to the spring element to store an initial quantity of mechanical potential energy which upon release causes the mass-spring unit of the power source to undergo free vibration. In addition to this initial parcel of energy from the pre-loading of the spring element, the devices can be designed to experience reinforcing excitation from sources such as platform vibrations, oscillatory motions, and acoustic noise.

Some key advantages of this class of devices are reliability, long shelf-life, near-instantaneous initial power delivery, and ruggedness. The release mechanism may be manually and/or remotely operated via an electrical signal. The release mechanism may be equipped with an arming pin which has to be removed before the release mechanism could be operated.

The piezoelectric-based power generation devices discussed below can be designed in numerous configurations with equivalent mass-spring elements that undergo axial, lateral, flexural, torsional or a combined mode of vibration to match the system power requirements and the available space and geometry. These devices may also be designed as integrated in the structure of the employing system to save space. These piezoelectric-based power sources may also be combined with other types of power sources to provide hybrid power sources with advantages of more than one type of power source design, for example, to make power available almost instantaneously via piezoelectric-type power generators and providing larger amount of electrical energy via an appropriate type of chemical power source.

FIGS. 8a and 8b shows a piezoelectric energy harvesting power source 400 which can be configured to have the aforementioned 1.7 inch in diameter and 3.5 inch long housing 402 and manual activation. The power source 400 includes a spring-mass device 404 including a mass 404a and generator spring 404b. The spring-mass device 404 is deflected and locked in place by a tensile locking element 406, storing mechanical potential energy in the generator spring 404b. In the device 400 of FIGS. 8a and 8b, the locking element 406 includes a locking shaft 406a that releasably mates with a corresponding hole 404c of the mass element 404a. Configurations for providing such releasable connections are well known in the art, such as the shaft 406a or a portion thereof being formed of a deformable material and having an interference fit with the corresponding hole 404c. When the locking element 406 is released, as shown in FIG. 8b, the spring-mass device 404 is free to vibrate at its natural frequency, and a cyclical load is transmitted to piezoelectric elements 408 positioned in between the generator spring 404b and the housing 402 of the power source 400. The locking element 406 is designed such that a reliable, abrupt manual release may be commanded, and that the locking interface is removed from the system during actuation to guard against component interference while the spring-mass device 404 is vibrating. To minimize losses from internal damping in the generator spring 404b, the system can be designed to operate at a low natural frequency. Maximizing the mass of the mass element 404a will work towards this goal. As shown in FIG. 8a, the pre-load displacement of the spring-mass device 404 is applied during device assembly. The design may be easily augmented with a mechanism to apply this deflection at point-of-use which may have certain safety advantages.

FIGS. 9a, 9b, 9c and 9d illustrate a similar device to the device in FIGS. 8a and 8b, referred to generally by reference numeral 450 but which uses a spring-tab locking element 452 which is under axial compression to maintain a pre-load deflection on the generator spring 404b. Once a key 454 of the locking element 452 is removed, tabs on the locking element 452 spring inward and allow the generator spring-mass device 404 to vibrate. The tabs can be biased together with a spring or due to the resiliency of the material forming such tabs. The locking element tab 452 remains attached to the mass element 404a, and has ample clearance between itself and the device housing to ensure unobstructed vibration. The advantage of having the locking element 452 remain with the mass element 404a during vibration is that the locking element 452 will contribute to the overall mass of the spring-mass device 404, lowering the natural frequency of vibration and increasing overall efficiency of the device. Along that logic, many other such releases may be designed which may be more massive and occupy more volume within the device, provided that they see dual use as additional mass for the spring-mass system. In this way, the field of viable release mechanisms which are both sophisticated and reliable may be broadened.

The main advantage of piezoelectric-based power sources is that they are very fast acting and once subjected to a mechanical force, they would generate an electric charge almost instantaneously (in a fraction of milliseconds). As such, such power sources are particularly suitable in applications in which electrical energy is to be provided very rapidly to power low power electronics devices or initiate a pyrotechnic material—such as electric-initiator-based energetic devices, such as Cartridge Actuated Devices (CAD) and Propellant Actuated Devices (PAD).

Piezoelectric elements, however, provide very low levels of charges (electrical energy) even when subjected to forces that generate stresses that are close to their strength levels (typically around 10,000 psi). For example, a typical piezoelectric (stack) element (from Noliac Corporation) that is 1.7 inch in diameter (the aforementioned diameter of the cylindrical power source considered), when it is loaded in compression up to its blocking force voltage of 200 Volts, would generate around 72 mJ of electrical energy per 1 mm of thickness. This is the reason why in the piezoelectric-based generators described in FIGS. 1*a* and 1*b*, a relatively large amount of mechanical energy is stored in spring elements and electrical energy is extracted a small amount at a time as the unit mass-spring system vibrates and exerts a cyclic load on the piezoelectric (stack) element of the power source. For example, if the natural frequency of the mass-spring unit of the power source is 200 Hz, then during each period of mass-spring vibration cycle, the piezoelectric element is subjected to one cycle of loading, thereby one cycle of compressive and one cycle of tensile loading. As a result, a significantly larger amount of electrical energy is generated over many cycles of mass-spring vibration until the vibration of the mass-spring unit is damped, mainly due to damping in the spring element material, energy extracted from the piezoelectric elements, and other electrical and mechanical losses. The total amount of energy that piezoelectric-based generators can generate is dependent on the amount of energy that they can harvest/scavenge from the platform vibration and oscillatory motions since they occur over longer periods of time. In most cases and when relatively large amounts of electrical energy needs to be generated, the amount of energy that is generated by the release of the initially stored mechanical energy has to be complemented by the aforementioned harvested/scavenged electrical energy or by forming a hybrid type of power source using sources such as stored chemical energy, e.g., by the use of high energy density thermal batteries or other types of sources of energy.

In general, the total amount of mechanical energy that is initially stored in the spring elements is maximized by selecting stiff enough springs that are deflected the maximum possible amount, since the stored mechanical energy is proportional to the spring rate and the square of the spring deflection. The mass element must also be high so that the natural frequency of vibration of the mass-spring unit is as low as possible since energy losses in such power sources are mostly due to the damping in the spring material. As a result, the natural frequency of vibration of the mass-spring units is generally chosen to be high enough so that the initial amount of required power can be made available rapidly, but is selected to be as low as possible to minimize the energy losses in the spring elements.

Since the piezoelectric elements shown in FIGS. 8*a*, 8*b* and 9*a* and 9*b* are highly brittle, they can be preloaded in compression to near half the vibration induced peak forces. As a result, the piezoelectric elements are not subjected to any tensile loading during the vibration of the mass-spring unit. In addition, the total amount of mechanical energy that is stored in the spring element of the power source is significantly larger due to the preloading of the spring.

The electrical energy collection and regulation electronics for harvesting the generated electrical charges in piezoelectric-based generators are well developed. Depending on the frequency of vibration of the mass-spring unit and the electrical energy storage medium and size, efficiencies of around 50% or even higher have been achieved.

It is also noted that one other advantage of the disclosed piezoelectric-based power sources is that the piezoelectric elements used in such generators act in fact as accelerometers (both before and after the power source activation). As such, they can also be used as event detection sensors input (possibly as auxiliary sensor input) to onboard electronics logic and decision making processors/circuitry of the CAD and PAD systems.

A schematic of a dynamo-type power source 500 is shown in FIG. 10. The power source 500 is also drawn to the aforementioned 1.7 inch in diameter and 3.5 inch long housing 502 dimensions for ease of comparison. In this power source 500, a spiral power spring 504 is used to store mechanical potential energy. The power spring 504 is pre-loaded during device assembly and locked by a simple clutch and release mechanism 506. Upon activation of the device 500, manually by pulling a lever or the like (not shown) or via an electrical signal to release the clutch and release device 506, the clutch and release mechanism 506 will permit torque to be transferred from the power spring to a dynamo generator rotor 508, which can also act as a flywheel, and where the kinetic energy of rotation is converted into electrical energy due to the relative rotation between the dynamo generator rotor 508 and dynamo generator stator 510. A one-way clutch 506 can be provided as part of the release mechanism such that the dynamo generator rotor 508 may continue to spin after the complete unwinding of the spiral power spring 504.

An advantage of this device is that it is very low-cost, easy to activate and easy to combine with other proposed concepts to form a hybrid solution. For example, piezoelectric elements may be used to attach the dynamo to the power source housing, thereby subjecting the piezoelectric elements to cyclic load as the dynamo rotates, thereby providing the means to very rapidly generate low but possibly enough electrical energy for initial powering of the system electronics. Alternatively, a smaller size power spring and dynamo may be used to serve as the mass of a piezoelectric-based mass-spring type generators similar to those described above. As a result, the power source can also serve to harvest/scavenge energy from the platform vibration, oscillatory motions and acoustic noise.

In addition, the technology for the design and fabrication of this class of devices and their energy collection, regulation and storage is well known. Such devices have also been shown to be highly reliable, have very long shelf-life, rugged and with the use of the aforementioned piezoelectric mounting elements, can provide near-instantaneous initial power. The release mechanism may be manually and/or remotely operated via an electrical signal. The release mechanism may be equipped with an arming pin which has to be removed before the release mechanism could be operated.

Such power sources can readily provide a medium level (e.g., in 10s of Js) of electrical energy from the stored mechanical energy in the power spring. For the significantly larger indicated amount of energy requirement, they can be used with either one of the disclosed energy harvesting/scavenging capabilities and/or be used in combination with other sources of input energy such as chemical energy in the form of reserve batteries or impulse generating charges as described below, or in the form of stored electrical energy in capacitors or super-capacitors.

Figure 12:
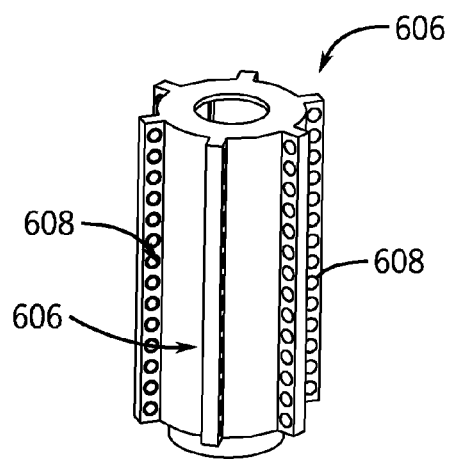
FIG. 12 illustrates a rotor and magnet assembly used in the propellant driven dynamo power source of FIG. 11.

In the dynamo-type power source concept described above, the stored mechanical energy in the power spring is converted to electrical energy by the dynamo generator. In an alternative power source device 600, a schematic of which is shown in FIG. 11, a housing 602 includes a stator and coil assembly 604 and rotor and magnet assembly 606. The dynamo generator is driven by successive initiation of discrete propellant charges 608 arranged about the periphery of the dynamo's rotor 610, as shown in FIG. 12. Initiation electronics 612 are provided in the housing 602 and can be considered to be physically attached to the rotor 610. There are varieties of methods of providing the initial power for initiating the first charge to get the generator started. For example, a smaller power spring similar to the one shown in FIG. 10 may be release upon activation of the power source or a small piezoelectric-based generator could be coupled with the power source "activation arm" or the like to provide the initial power to initiate the first propellant charge. The generated power can then be used to keep the power generation process to continue. For example, the initiation electronics 612 can be used to initiate the propellant charges sequentially with a predetermined delay time.

Some key advantages of this class of device are reliability, long shelf-life, near-instantaneous initial power delivery, and ruggedness. The activation mechanism may be manually and/or remotely operated via an electrical signal. The release mechanism may be equipped with an arming pin which has to be removed before the release mechanism could be operated.

This design concept is highly scalable (i.e. varying axial length) and lends itself to hybridization with other methods of power generation presented in other concepts, placed above or below the propellant-driven dynamo concept.

Figure 13:
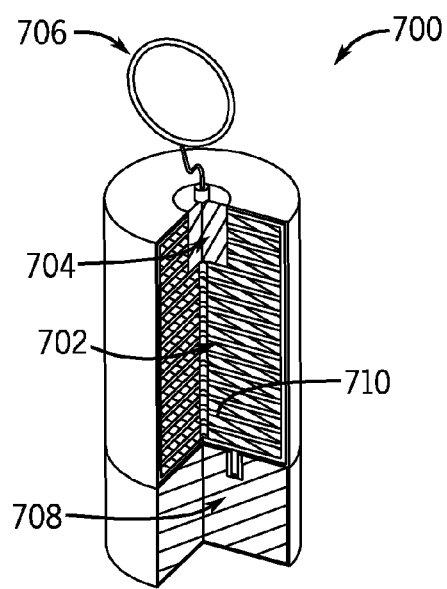
FIG. 13 illustrates a cut-away sectional view of a combined thermal battery and super-capacitor power source.

A schematic of a manually-initiated power source 700 having a thermal battery coupled with a storage super-capacitor is shown in FIG. 13. In this power source 700, the thermal battery 702 is actuated by a manually initiated pyrotechnic igniter 704, such as by manually actuating a lever (or the like) to release a spring-loaded pin to initiate a pyrotechnic initiator, (e.g., producing a flame/spark resulting from movement of the lever or the like). Such initiators are well known in the art. FIG. 13 illustrates the pyrotechnic igniter 704 to be inserted into a portion of the thermal battery 702 and when removed, such as by pulling a pull-ring 706, resultant flame and sparks travel through a central corridor 710 of the thermal battery, igniting the battery's pyrotechnics and initiating the thermal battery 702. The battery energy is then discharged into a storage super-capacitor 708 where the energy is available for a wide range of power budget time profiles. The pyrotechnic initiator 704 shown in the conceptual schematic utilizes a pull-ring 706, however any number of linear or rotary mechanical inputs could be accommodated such as push-buttons, push or pull levers, rotational keys, etc. to provide the necessary flame/sparks to initiate the thermal battery 702. The release mechanism may be equipped with an arming pin which has to be removed before the release mechanism 704 could be operated.

Such thermal battery and super-capacitor power source 700 has similarity with currently used power sources since they both use thermal batteries as the source of electrical energy. However, it operates differently and the thermal battery portion may be different from thermal batteries that are commonly used. These differences include the following:

The thermal battery can utilize film technology to make the manufacturing process automated, thereby significantly reducing the production cost and the unit cost;

The thermal battery can be fast acting (rise time less than 50 milliseconds) and is packaged with minimal insulation material, thereby making the battery volume significantly smaller;

The battery does not require a considerable amount of insulation since their electrical energy is rapidly transferred to the provided super-capacitor upon activation;

The battery provides power to the system rapidly in around 50 milliseconds and as the energy is transferred to the super-capacitor, the super-capacitor becomes the main source of power to the system;

The power source can provide power for a very long time (even days) since super-capacitors with negligible leakage that are commercially available can be used.

The possibilities for the design of hybrid power sources, synthesized from the various concepts thus-far presented and possibly by incorporation of other means of scavenging/harvesting power from the environment such as the use of temperature difference (thermoelectric cells), optical (TPV or PV cells) or RF energy sources. Other possibilities would also arise when considering the potential integration of the power source components and/or the energy harvesting/scavenging components into the structure of the CAD, PAD and other similar devices.

All designs presented herein are fundamentally scalable, e.g., along the axis of the indicated design volume. This allows for positioning the sub-systems in series along the axis or in parallel in the design volume. Additionally, radial symmetry and generally prismatic and annular cross-sections of each of the concepts may allow for the "nesting" of two or more prime concepts. For example, an annular capacitor may be placed at the periphery of a piezoelectric generator or rotating dynamo. A less obvious potential solution would be to utilize a thermal battery as the centrally-located mass element in a vibrating spring-mass piezoelectric generator. Virtually all combinations of the prime concepts presented will result in a specific combination of advantages and disadvantages for a particular application. In addition, one may utilize the unused spaces of the system (if any) to "distribute" the components of a hybrid system, for example incorporate the piezoelectric generator portion in the activation mechanism and the super-capacitors into the system electronics boards.

The following is a partial list of the possible hybrid power sources:

1. A hybrid power source may be constructed by a piezoelectric-based generator for very rapid powering of the system electronics (in 2-3 milliseconds following activation), a less expensive (preferably the aforementioned "standardized" thermal battery), and one or more super-capacitors, possibly positioned in series along the axis of the indicated design volume or preferably positioned to take maximum advantage of the available (CAD, PAD or other similar) system volume to reduce the overall system volume. With a single (manual or electrical) input, the piezoelectric generator may be triggered and the thermal battery initiated (alternatively, thermal battery may be initiated electrically by the piezoelectric generator power), and the electrical energy is used directly with the excess stored in the super-capacitor for use as needed over longer time than possible with any thermal battery alone. Such a design would provide the high energy-per-unit-volume of a thermal battery, and combat the thermal battery's slow rise-time with an amount of energy available almost instantaneously from the piezoelectric generator. Depending on the application-specific power budget, energy may be used immediately from either source or stored on the super-capacitor.

2. A hybrid power source may be constructed by a piezo-electric-based generator for very rapid powering of the system electronics and a dynamo-type generator with stored mechanical energy as illustrated in the schematic of FIG. 10. Alternatively, the dynamo generator may be powered by propellant charges as shown in the schematics of FIGS. 11 and 12.

3. Any one of the power source concepts presented above may be supplemented with other aforementioned energy harvesting/scavenging power from the environment such as the use of temperature difference (thermoelectric cells), optical (TPV or PV cells) or RF energy sources, or the like.

The novel piezo-magneto generators disclosed above can also be actuated by applying an impact to a housing or other impact receiving surface that houses the generator. Consequently, such piezo-magneto generators have widespread commercial use in providing emergency power for electronic/electrical devices. Such piezo-magneto generators may be used for the sole power source for such devices or provide back-up power when the device's battery has run out of charge. For example, the piezo-magneto generator may be integrated in a device for generating a distress signal for lost hikers which does not utilize a battery. Although the device does not include a battery, it can be powered at any time by impacting a portion of it against a hard surface. The user does not have to worry about losing battery power or having dead batteries when it is needed. The piezo-magneto generator for providing the distress signal can be provided in a key fob configured unit or integrated into a hiking boot or other type shoe. In the latter, the distress signal is generated simply by impacting a portion of the shoe against a hard surface and can be repeatedly generated by occasionally providing the impact. The user does not have to worry about running out of battery power. U.S. Application Publication No. 2009/0224908 discloses such devices. The distress signal device is an example of a device that would utilize the piezo-magneto generators as the sole source of power. However, the piezo-magneto generators can also be utilized to provide back-up power to battery powered devices. For example, the piezo-magneto generators can be provided in a stand along package that connects to a cell phone and, when impacted, can provide power to charge the cell phone's battery. Thus, in an emergency situation where the cell phone's usage is of the utmost importance, the problem of a low or dead battery can be overcome by using the piezo-magneto generators to charge the battery. As discussed above with the distress signal generator, unlike battery power, power from the piezo-magneto generators would be available continuously as long as the user occasionally impacts the device/generator against a hard surface.

In addition, the piezo-magneto generators can be integrated into portable devices as their sole source of power. Such devices would not require batteries (or can alternatively have rechargeable batteries that can be continuously charged by the integrated piezo-magneto generator). Examples of such devices are emergency devices, such as flashlights and radios, where power when you need it in emergency situations is crucial. Storing batteries in flashlights and radios is of no use where the batteries have died or are very low on power when they are needed in an emergency. Batteries may also leak chemicals and render the device inoperable. The piezo-magneto generators can be integrated into the device to power the device when a portion of the device is impacted against a hard surface. U.S. Pat. No. 7,777,396 discloses a piezo generator version of such devices, including flashlights and U.S. Ser. No. 12/839,305 for magnet/coil versions of such device and U.S. Ser. No. 12/839,316 for an impact power generation method in general, the contents of each of which are incorporated herein by reference.

The piezo-magneto generators can also be provided in "battery" sized packs that are used in devices that are otherwise powered by batteries. For example, the piezo-magneto generator can be configured to fit within a casing that is the same size and configuration as a standard cell battery (D, C, AAA, AA etc.) and such casing can be used in a device in place of a standard sized battery. In the case of a flashlight, the piezo-magneto generators can be placed in a casing the size of a D cell battery and include electronics that would mimic the output of the D cell battery when the device is impacted. In this way, any device which uses batteries and has a surface that can withstand an impact (or can be adapted to withstand an impact) can be powered without batteries and enjoy power whenever it is needed without the problems associated with batteries. The piezo-magneto generator based batteries would also solve the problems associated with disposal of batteries, providing a green alternative to batteries.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A power generation device comprising:
a housing;
an elastic element disposed in the housing in a preloaded state;
a power source operatively connected to the elastic element such that release of the elastic element from the preloaded state converts potential energy in the elastic element to electric power by the power source; and
a locking element for releasably locking the elastic element in the preloaded state such that removing the locking element causes the potential energy preloaded in the elastic element to be converted to electric power by the power source;
wherein the elastic element is a torsional spring, which when released, provides rotation to a shaft of a dynamo generator operatively connected to the torsional spring.

2. The power generation device of claim 1, further comprising a clutch operatively connected between the torsional spring and the shaft of the dynamo.

3. A power generation device, comprising:
a housing;
an elastic element disposed in the housing in a preloaded state;
a power source operatively connected to the elastic element such that release of the elastic element from the preloaded state converts potential energy in the elastic element to electric power by the power source; and
a locking element for releasably locking the elastic element in the preloaded state such that removing the locking element causes the potential energy preloaded in the elastic element to be converted to electric power by the power source;

wherein the elastic element is a spring and the spring is coupled to a mass to form a mass-spring unit; and
the locking element is disposed in a bore in the mass.

4. The power generation device of claim 3, wherein the locking element further comprises a pull ring for facilitating manual removal of the locking element from the bore in the mass.

5. The power generation device of claim 3, wherein the mass further includes locking tabs and the locking element is retained to the mass by engagement of the locking tabs with the locking element.

6. The power generation device of claim 3, wherein the power source is a piezoelectric material disposed in the housing such that release of the locking element vibrates the mass-spring unit resulting in a cyclic compressive load being applied to the piezoelectric material to generate the electric power from the piezoelectric material.

7. The power generation device of claim 6, wherein the piezoelectric material is disposed between an inner surface of the housing and a surface of the spring.

* * * * *